United States Patent

Jaffe

(10) Patent No.: US 6,356,849 B1
(45) Date of Patent: Mar. 12, 2002

(54) METHOD FOR AUTOMATICALLY SCALING SAMPLED REPRESENTATIONS OF SINGLE-VALUED AND MULTI-VALUED WAVEFORMS

(75) Inventor: Stanley E. Jaffe, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/493,516

(22) Filed: Jan. 28, 2000

(51) Int. Cl.[7] .............................................. G01R 13/20
(52) U.S. Cl. ....................................................... 702/66
(58) Field of Search .............................. 702/66, 67, 69, 702/70, 73, 79; 324/76.12, 76.13

(56) References Cited

U.S. PATENT DOCUMENTS

| | | | |
|---|---|---|---|
| 5,706,204 A | * 1/1998 | Cox et al. | 364/487 |
| 5,787,005 A | * 7/1998 | Millerd, Jr. et al. | 364/487 |
| 5,828,983 A | * 10/1998 | Lombardi | 702/66 |
| 5,926,486 A | * 7/1999 | Siulinski | 371/22.1 |
| 5,939,877 A | * 8/1999 | Alexander | 324/121 R |
| 5,987,392 A | * 11/1999 | Tucker et al. | 702/66 |
| 6,201,384 B1 | * 3/2001 | Alexander | 324/121 R |
| 2001/0001137 A1 | * 5/2001 | Alexander | 702/68 |
| 2001/0001849 A1 | * 5/2001 | Felps | 702/66 |

* cited by examiner

Primary Examiner—Patrick Assouad
(74) Attorney, Agent, or Firm—John L. Imperato

(57) ABSTRACT

A method automatically scales a sampled representation of a waveform applied to a sampling system, regardless of the nature of the waveform. The method, implemented within a digital oscilloscope or other type of sampling system, achieves amplitude auto-scaling from samples of the applied waveform acquired when the sampling system is un-triggered. The method then determines the nature of the applied waveform based on the number of acquired samples within an intermediate amplitude band and the number of amplitude transitions across the amplitude band. Records are then taken with the sampling system triggered and the occurrence of alternative designated events, based on the nature of the waveform, is detected within the records. Time offset and time gain are adjusted based on a first occurrence and a second occurrence of the designated event.

20 Claims, 5 Drawing Sheets

METHOD FOR AUTOMATICALLY SCALING SAMPLED REPRESENTATIONS OF SINGLE-VALUED AND MULTI-VALUED WAVEFORMS

BACKGROUND OF THE INVENTION

Sampling systems, such as digital oscilloscopes, sample and display characteristics of various types of applied waveforms. One type of waveform that may be applied to a sampling system, a single-valued waveform, is repetitive in time. Multi-valued waveforms, such as random or pseudo-random digital streams present in communication networks, may also be applied. Alternatively, noise, rather than single-valued or multi-valued waveforms, may be applied to the sampling system.

Automatic adjustment of system parameters, or auto-scaling, enables users of the sampling system to observe the characteristics of the applied waveform displayed on a monitor or other output device. For example, automatic adjustment of amplitude gain and offset parameters (amplitude auto-scaling) vertically positions the sampled representation of the applied waveform on a digital oscilloscope's monitor so that amplitude characteristics of the waveform can be displayed. Similarly, automatic adjustment of time gain and offset parameters (time auto-scaling) horizontally positions a sampled representation of the applied waveform so that timing characteristics of the waveform can be displayed.

While automatic adjustment of system parameters is generally difficult within a sampling system when there are various types of waveforms that may be applied to the system, time auto-scaling is especially difficult to achieve. Auto-scaling methods that detect one type of event, such as zero-crossings within the applied waveform, are suitable for establishing and adjusting time gains and offsets for single-valued waveforms, but the methods may be unsuitable for establishing and adjusting time parameters for multi-valued waveforms, which generally lack repetitive zero-crossings. Each type of waveform applied to the sampling system requires detection of a different type of event for time auto-scaling. There is a need for a method that automatically scales a sampled representation of an applied waveform, regardless of whether the waveform is single-valued or multi-valued in nature.

SUMMARY OF THE INVENTION

An auto-scaling method constructed according to the preferred embodiment of the present invention auto-scales a sampled representation of an applied waveform, regardless of the nature of the waveform. The method, implemented within a digital oscilloscope or other type of sampling system, achieves amplitude auto-scaling from samples of the applied waveform acquired when the sampling system is un-triggered. The method then determines the nature of the applied waveform based on the number of acquired samples within an intermediate amplitude band and the number of amplitude transitions across the amplitude band. Records are then taken with the sampling system triggered and the occurrence of alternative designated events, based on the nature of the waveform, is detected within the records. Time offset and time gain are adjusted based on a first occurrence and a second occurrence of the designated events.

DETAILED DESCRIPTION OF THE PREFERRED EMBODIMENT

Figure 1:
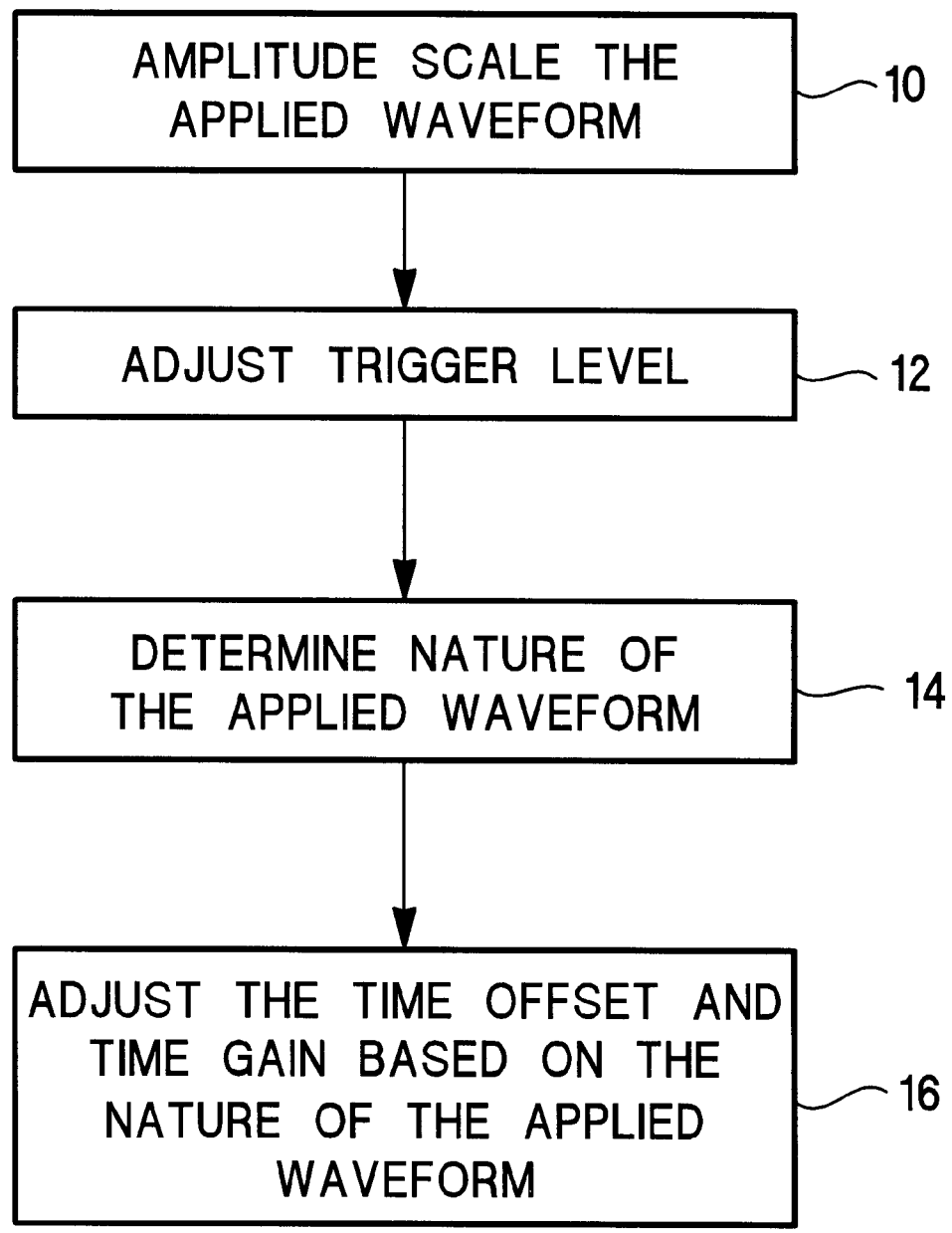
FIG. 1 is a flow diagram of the time scaling method constructed according to the preferred embodiment of the present invention.

FIG. 1 is a flow diagram of the auto-scaling method constructed according to the preferred embodiment of the present invention. The auto-scaling method is for a digital oscilloscope or any other type of sampling system that acquires samples of applied waveforms. In step 10 of the flow diagram, parameters of the sampling system are adjusted for amplitude auto-scaling the applied waveform. In step 12, the sampling system is triggered. In step 14, the nature of the applied waveform is determined and in step 16, the time offset and time gain for the sampling system are adjusted for time auto-scaling of the applied waveform.

Figure 2A:
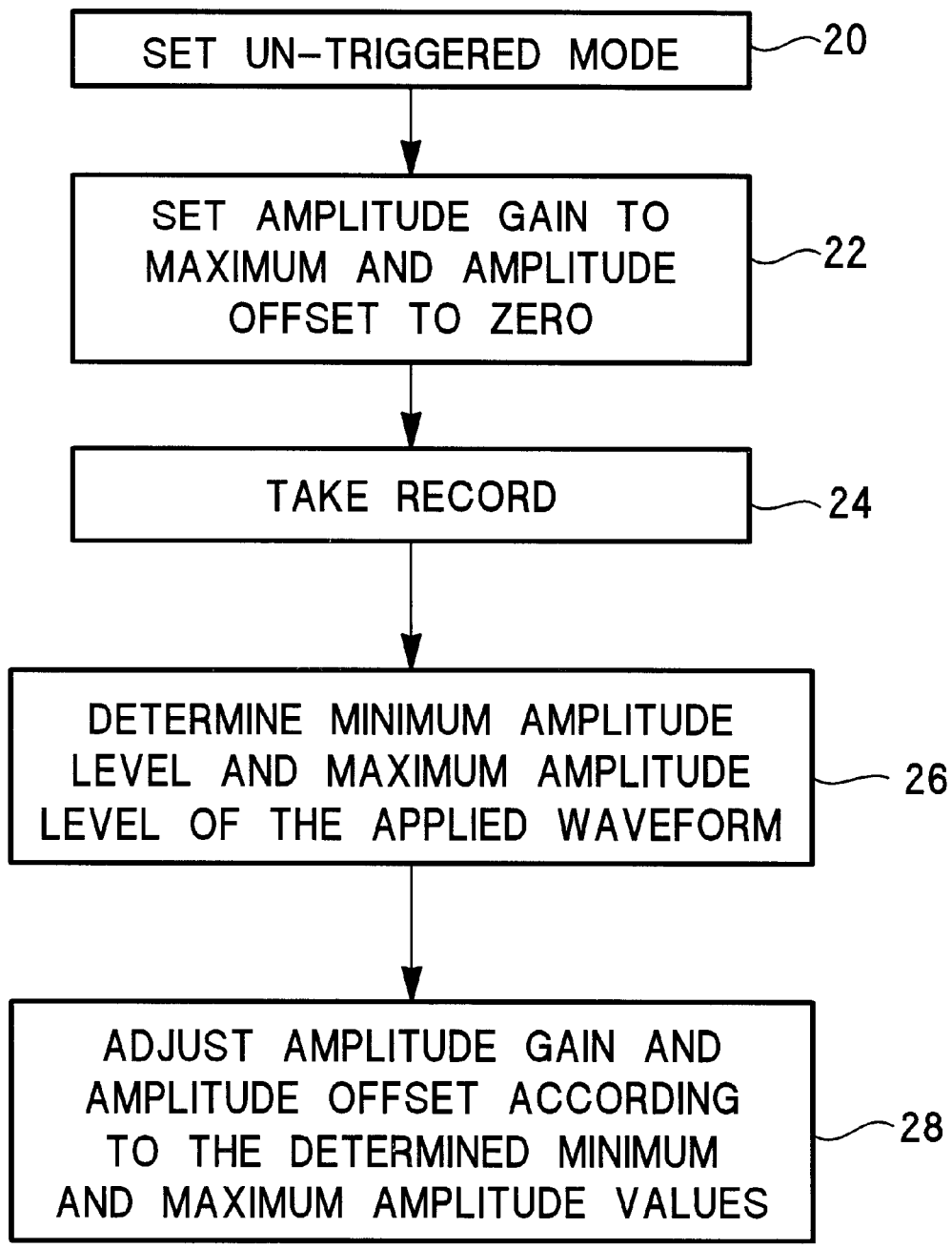
FIG. 2A is a first detailed view of the flow diagram of FIG. 1.

FIG. 2A is a detailed view of step 10 of the flow diagram of FIG. 1. In step 20 of FIG. 2A, the sampling system is operated in an un-triggered, or free-running, mode. The amplitude gain of the sampling system is set to a maximum and the amplitude offset of the system is set to a minimum, such as zero, in step 22. The settings in step 22 are chosen to reduce the likelihood that clipping of the maximum-amplitude and minimum-amplitude portions of the applied waveform will occur when a sampled representation of the waveform is presented to a monitor or other output device used with, or included within, the sampling system. Settings of maximum amplitude gain and minimum offset are those settings that are sufficient to avoid clipping of the applied waveform.

In step 24, a record is taken to acquire samples of the applied waveform in the un-triggered mode. In step 26, a minimum amplitude level and maximum amplitude level of the applied signal are determined. These determinations are based on statistics of the acquired samples or running averages of the acquired samples. Alternatively, the minimum amplitude level and maximum amplitude level are based on the lowest and highest sample values, respectively, acquired in the record.

In step 28, the amplitude gain and amplitude offset are set according to the determined minimum amplitude level and maximum amplitude level from step 26. For example, in a digital oscilloscope, setting the amplitude gain and offset typically entails automatically adjusting the number of volts per division and the voltage offset controls in order to vertically position a sampled representation of the applied waveform on the digital oscilloscope's monitor.

Figure 2B:
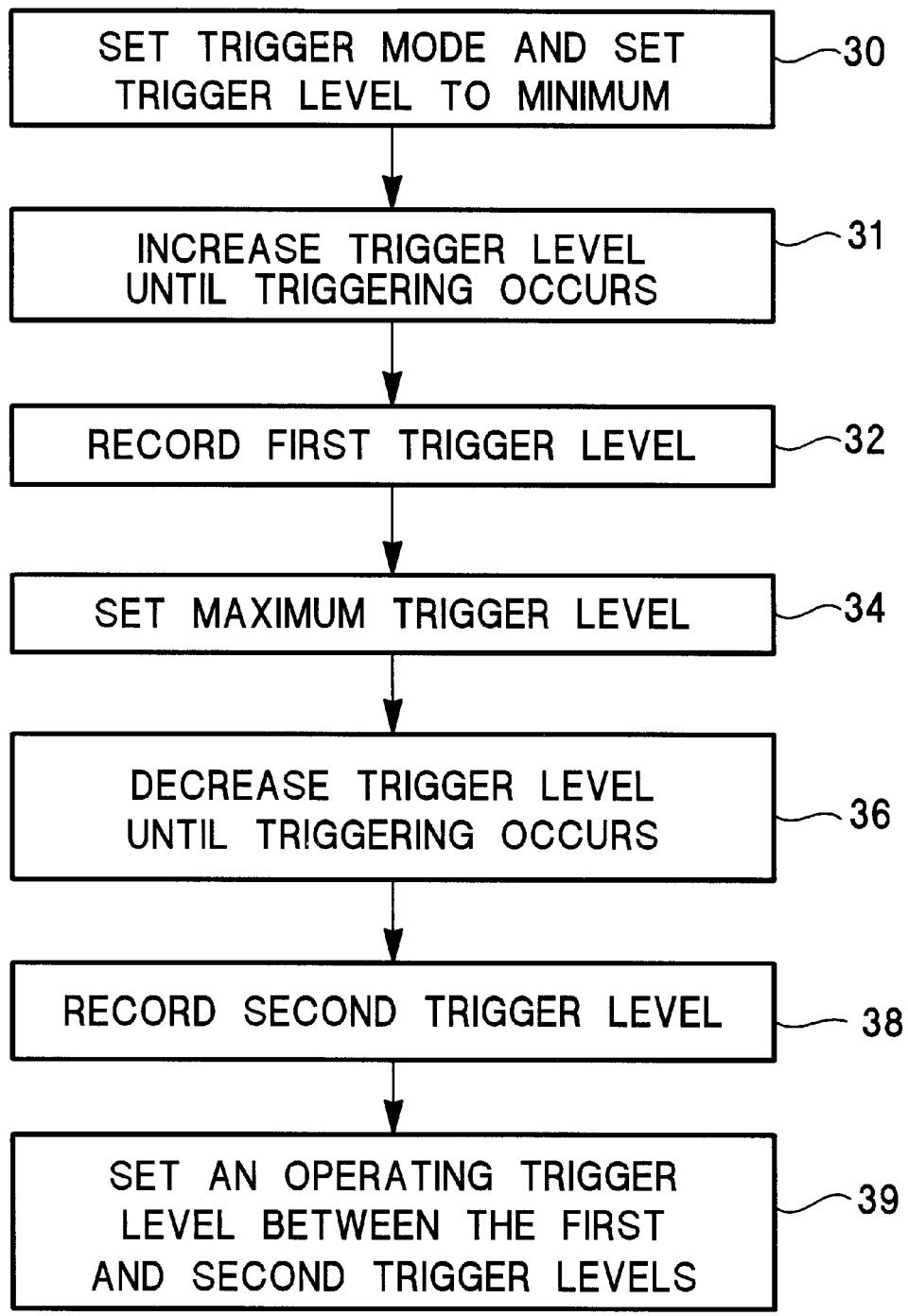
FIG. 2B is a second detailed view of the flow diagram of FIG. 1.

FIG. 2B is a detailed view of step 12 of the flow diagram of FIG. 1. In step 30 of FIG. 2B, the sampling system is set in a triggered mode and the trigger level is set to a minimum. In step 31, the trigger level is then increased until the sampling system is triggered. This trigger level is recorded as a lower trigger level in step 32. The trigger level is then set to a maximum in step 34 and is decreased until the sampling system is triggered again in step 36. This trigger level is recorded in step 38 as an upper trigger level. In step 39, an operating trigger level is defined between the lower trigger level and the upper trigger level and the trigger level of the sampling system is adjusted to this operating trigger level. Steps 30–39 of FIG. 2B ensure that the trigger level is set at an operating trigger level that is between the lower and upper trigger levels so that the sampling system remains triggered, despite fluctuation in amplitude and offset of the trigger signal associated with the applied waveform. As an alternative to steps 30–39, the sampling system is triggered, in step 12 of the flow diagram in FIG. 1, by adjusting the trigger level to any operating trigger level at which the sampling system remains triggered.

Figure 2C:
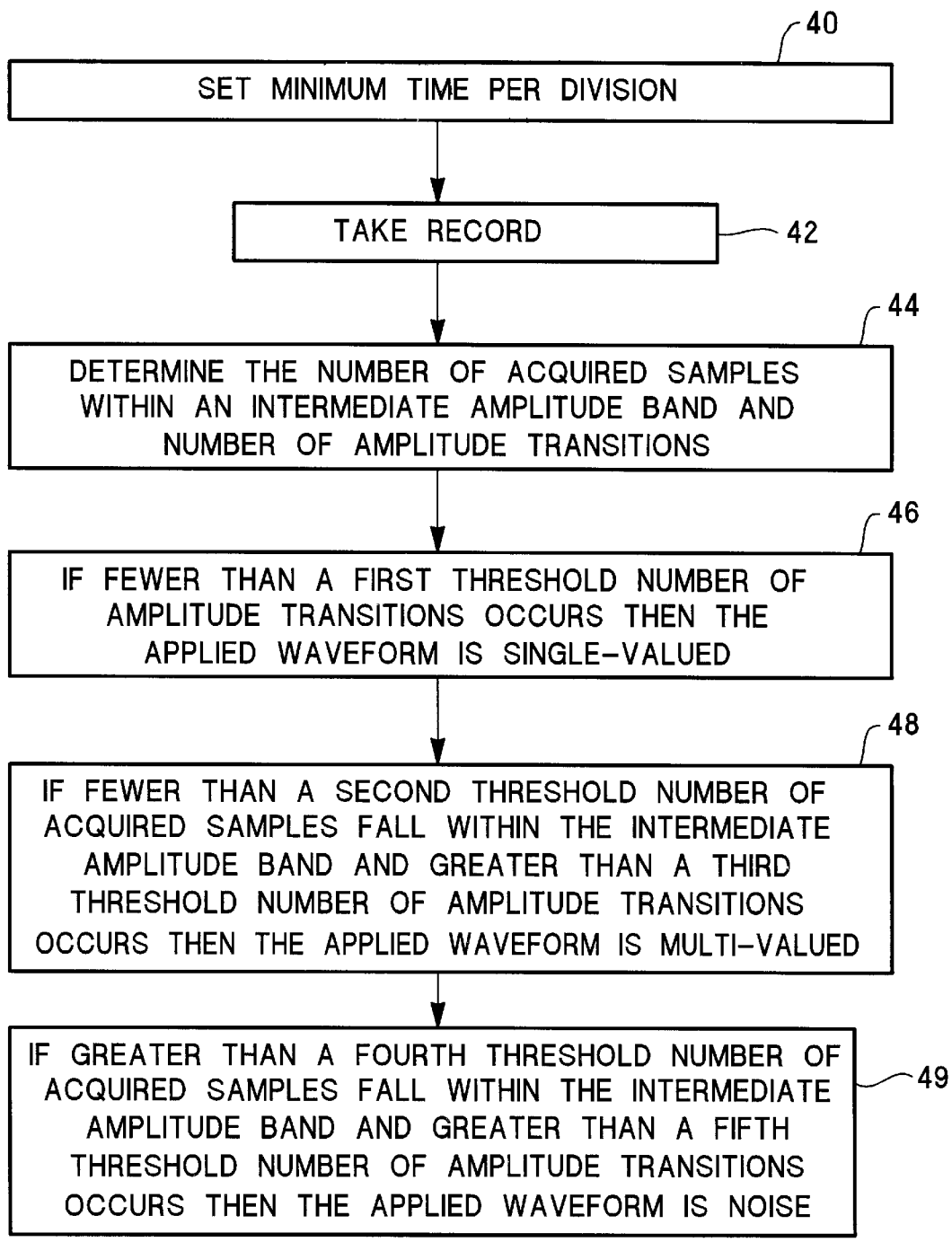
FIG. 2C is a third detailed view of the flow diagram of FIG. 1.

FIG. 2C is a detailed view of step 14 of the flow diagram of FIG. 1. In step 40 of FIG. 2C, the time gain of the sampling system is set to a minimum. In a digital oscilloscope, for example, step 40 is implemented by automatically adjusting the number of seconds per division to a minimum value. Amplitude auto-scaling in step 10, and the operating trigger level in step 12 have been performed and the sampling system is triggered. A record is then taken in step 42 to acquire samples of the applied waveform. In step 44, the number of acquired samples falling within a pre-defined amplitude band intermediately positioned within the minimum and maximum amplitude levels determined in step 26, is counted. In step 44, the number of amplitude transitions across the amplitude band that occur is also counted. An amplitude transition across the amplitude band occurs when one acquired sample within the record falls outside of the amplitude band on a first side of the amplitude band, and a subsequent sample within the record also falls outside the amplitude band, but on the opposite side of the amplitude band. For a single amplitude transition, no samples within the record that are between the one sample on the first side of the amplitude band and the subsequent sample on the opposite side of the amplitude band also fall outside the amplitude band. In this example, the amplitude band is centered between the minimum and maximum amplitude levels and spans an amplitude range that is equal to approximately five percent of the range between the minimum and maximum amplitude levels.

In steps 46–49, the nature of the applied waveform is determined based on the number of acquired samples within the amplitude band and the number of amplitude transitions, as counted in step 44. In step 46, the waveform is determined to be single-valued in nature when fewer than a first threshold number of amplitude transitions occur. As an example, for a record having three thousand samples, the first threshold number is ten. In step 48, the waveform is determined to be multi-valued in nature when fewer than a second threshold number of acquired samples occur within the intermediate amplitude band and greater than a third threshold number of amplitude transitions occur. With the record having three thousand samples, as in the previous example, the second threshold number is three hundred and the third threshold number is ten. In step 49, the waveform is designated to be noise when greater than a fourth threshold number of acquired samples occur within the intermediate amplitude band and greater than a fifth threshold number of amplitude transitions occur. For the record having three thousand samples, the fourth threshold number is three hundred and the fifth threshold number is ten. The five threshold numbers are preferably chosen empirically, analytically or by any other method that enables the applied waveform to be designated as single-valued, multi-valued or as noise.

Figure 2D:
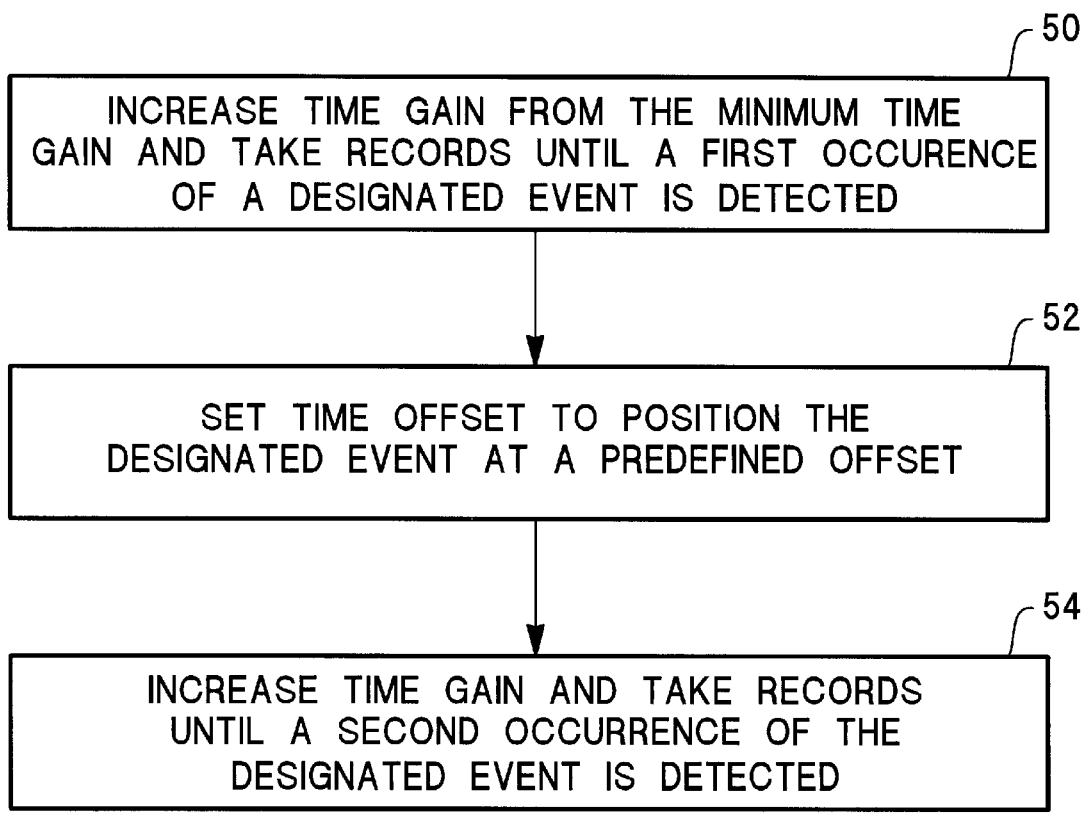
FIG. 2D is a fourth detailed view of the flow diagram of FIG. 1.

FIG. 2D is a detailed view of step 16 of the flow diagram of FIG. 1. In step 50, the time gain is increased from the minimum as set in step 40 of FIG. 2C. In step 50, the time gain is gradually increased and a record is taken at each increment of the time gain until a first occurrence of a designated event is detected. When steps 46–49 of FIG. 2C indicate that the waveform is single-valued in nature, the first occurrence of the designated event is a first amplitude transition detected within the acquired samples of the record taken. When steps 46–49 of FIG. 2C indicate that the waveform is multi-valued in nature, the first occurrence of the designated event is a first cluster of acquired samples occurring within the intermediate amplitude band.

In step 52, the time offset is adjusted to set the position of the first occurrence of the designated event. For example, in a digital oscilloscope, step 52 is implemented by adjusting the offset to horizontally position the zero-crossing or first cluster of acquired samples, depending on the nature of the applied waveform, at the left edge of the oscilloscope's monitor.

In step 54, the time gain continues to be gradually increased and corresponding records are taken at each increment of the time gain until a second occurrence of the designated event is detected. When the waveform is single-valued in nature, the second occurrence of the designated event is a second amplitude transition detected within the acquired samples of the record taken. When the waveform is multi-valued in nature, the second occurrence of the designated event is a second cluster of acquired samples occurring within the predefined amplitude band. The resulting time gain when the second occurrence of the designated event is detected in step 54 is sufficient to display a portion of the applied waveform as defined by the first occurrence and second occurrence of the designated event. When the applied waveform is single-valued in nature, the time gain and time offset resulting in step 54 are optionally further adjusted in order to-display a predefined number of repetitive cycles of the waveform as represented by the acquired samples. When the applied waveform is multi-valued in nature, the time gain and time offset resulting in step 54 are optionally further adjusted in order to display a predefined number of eyes, for example, in an eye diagram of the applied waveform as represented by the acquired samples. Steps 50–54 are omitted when the applied waveform is determined to be noise since adjustment of time offset and time gain are generally inapplicable to noise.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A method of auto-scaling a sampled representation of a waveform applied to a sampling system, comprising:

scaling the amplitude of the sampled representation of the applied waveform;

triggering the sampling system;

acquiring samples of the applied waveform;

counting the number of the acquired samples that occur within an intermediate amplitude band;

counting the number of amplitude transitions across the intermediate amplitude band that occur within the acquired samples;

determining the nature of the applied waveform based on the counted number of samples within the intermediate amplitude band and the counted number of amplitude transitions; and setting a time offset and a time gain for the sampled representation of the applied waveform based on the occurrence of events designated according to the determined nature of the applied waveform.

2. The method of claim 1 wherein scaling the amplitude includes;
   setting an amplitude gain of the sampling system to a maximum and setting an amplitude offset of the sampling system to a minimum,
   taking a record to acquire samples of the applied waveform in an un-triggered mode,
   determining a minimum amplitude level and a maximum amplitude level of the applied waveform based on the samples in the record,
   adjusting the amplitude gain and amplitude offset according to the determined minimum amplitude level and the determined maximum amplitude level.

3. The method of claim 1 wherein determining the nature of the applied waveform includes designating the waveform as single-valued when fewer than a first threshold number of amplitude transitions occur.

4. The method of claim 1 wherein determining the nature of the applied waveform includes designating the waveform as multi-valued when fewer than a second threshold number of acquired samples occur within the intermediate amplitude band and greater than a third threshold number of amplitude transitions occur.

5. The method of claim 1 wherein determining the nature of the applied waveform includes designating the waveform as noise when greater than a fourth threshold number of acquired samples occur within the intermediate amplitude band and greater than a fifth threshold number of amplitude transitions occur.

6. The method of claim 1 wherein setting a time offset and a time gain includes;
   setting the time gain of the sampling system to a minimum,
   increasing the time gain and taking corresponding records at each increment of the time gain until a first occurrence of a designated event is detected,
   setting the time offset to position the first occurrence of the designated event,
   increasing the time gain further and taking corresponding records at each further increment of the time gain until a second occurrence of the designated event is detected, and
   setting the time gain to position the second occurrence of the designated event.

7. The method of claim 1 wherein triggering the sampling system includes;
   setting the sampling system to a triggered mode,
   setting a trigger level of the sampling system to a minimum,
   increasing the trigger level until triggering occurs and recording a first trigger level,
   setting the trigger level to a maximum,
   decreasing the trigger level until triggering occurs and recording a second trigger level, and
   setting an operating trigger level between the recorded first trigger level and the recorded second trigger level.

8. The method of claim 2 wherein triggering the sampling system includes;
   setting the sampling system to a triggered mode,
   setting a trigger level of the sampling system to a minimum,
   increasing the trigger level until triggering occurs and recording a first trigger level,
   setting the trigger level to a maximum,
   decreasing the trigger level until triggering occurs and recording a second trigger level, and
   setting an operating trigger level between the recorded first trigger level and the recorded second trigger level.

9. The method of claim 2 wherein setting a time offset and a time gain includes;
   setting the time gain of the sampling system to a minimum,
   increasing the time gain and taking corresponding records at each increment of the time gain until a first occurrence of a designated event is detected,
   setting the time offset to position the first occurrence of the designated event,
   increasing the time gain further and taking corresponding records at each further increment of the time gain until a second occurrence of the designated event is detected, and
   setting the time gain to position the second occurrence of the designated event.

10. The method of claim 8 wherein setting a time offset and a time gain includes;
    setting the time gain of the sampling system to a minimum,
    increasing the time gain and taking corresponding records at each increment of the time gain until a first occurrence of a designated event is detected,
    setting the time offset to position the first occurrence of the designated event,
    increasing the time gain further and taking corresponding records at each further increment of the time gain until a second occurrence of the designated event is detected, and
    setting the time gain to position the second occurrence of the designated event.

11. The method of claim 2 wherein determining the nature of the applied waveform includes designating the waveform as single-valued when fewer than a first threshold number of amplitude transitions occur.

12. The method of claim 2 wherein determining the nature of the applied waveform includes designating the waveform as multi-valued when fewer than a second threshold number of acquired samples occur within the intermediate amplitude band and greater than a third threshold number of amplitude transitions occur.

13. The method of claim 2 wherein determining the nature of the applied waveform includes designating the waveform as noise when greater than a fourth threshold number of acquired samples occur within the intermediate amplitude band and greater than a fifth threshold number of amplitude transitions occur.

14. The method of claim 8 wherein determining the nature of the applied waveform includes designating the waveform as single-valued when fewer than a first threshold number of amplitude transitions occur.

15. The method of claim 8 wherein determining the nature of the applied waveform includes designating the waveform as multi-valued when fewer than a second threshold number of acquired samples occur within the intermediate amplitude band and greater than a third threshold number of amplitude transitions occur.

16. The method of claim 8 wherein determining the nature of the applied waveform includes designating the waveform as noise when greater than a fourth threshold number of acquired samples occur within the intermediate amplitude band and greater than a fifth threshold number of amplitude transitions occur.

17. The method of claim 10 wherein determining the nature of the applied waveform includes designating the waveform as single-valued when fewer than a first threshold number of amplitude transitions occur.

18. The method of claim 10 wherein determining the nature of the applied waveform includes designating the waveform as multi-valued when fewer than a second threshold number of acquired samples occur within the intermediate amplitude band and greater than a third threshold number of amplitude transitions occur.

19. The method of claim 10 wherein determining the nature of the applied waveform includes designating the waveform as noise when greater than a fourth threshold number of acquired samples occur within the intermediate amplitude band and greater than a fifth threshold number of amplitude transitions occur.

20. The method of claim 6 wherein the designated event is an amplitude transition within the acquired samples when the nature of the waveform is determined to be single-valued and wherein the designated event is a cluster of acquired samples within the intermediate amplitude band when the nature of the waveform is determined to be multi-valued.

* * * * *